United States Patent
Van De Graaff (10) Patent No.: US 6,741,504 B2
(45) Date of Patent: May 25, 2004

(54) METHOD AND APPARATUS FOR REDUCING GATE-INDUCED DIODE LEAKAGE IN SEMICONDUCTOR DEVICES

(75) Inventor: Scott Van De Graaff, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/199,409

(22) Filed: Jul. 19, 2002

(65) Prior Publication Data

US 2004/0013005 A1 Jan. 22, 2004

(51) Int. Cl.$^7$ ................................................. G11C 7/00
(52) U.S. Cl. .............................. 365/189.11; 365/189.09; 365/226
(58) Field of Search ....................... 365/189.11, 189.09, 365/230.06, 226, 227; 327/536, 535, 534, 537, 530; 323/280; 331/57

(56) References Cited

U.S. PATENT DOCUMENTS

| | | | | |
|---|---|---|---|---|
| 5,038,325 A | * | 8/1991 | Douglas et al. ......... | 365/189.06 |
| 5,126,590 A | * | 6/1992 | Chern ......................... | 327/536 |
| 5,355,097 A | * | 10/1994 | Scott et al. .................. | 331/1 A |
| 5,532,953 A | * | 7/1996 | Ruesch et al. ............... | 365/145 |
| 6,090,671 A | * | 7/2000 | Balasubramanyam et al. ........................... | 438/291 |
| 6,097,070 A | * | 8/2000 | Mandelman et al. ....... | 257/389 |
| 6,289,295 B1 | * | 9/2001 | Hill ............................. | 703/1 |
| 6,297,105 B1 | * | 10/2001 | Guo ........................... | 438/286 |
| 6,310,802 B1 | * | 10/2001 | Ma et al. ................... | 365/189.06 |

* cited by examiner

Primary Examiner—Gene Auduong
(74) Attorney, Agent, or Firm—Browning Bushman P.C.; Hugh R. Kress (57) ABSTRACT

A pumped voltage generating circuit for a semiconductor device is disclosed in which measures are taken to minimize undesirable gate-induced diode leakage, especially during standby or idle states of operation of the device. In one embodiment, the pumped voltage generating circuit comprises a charge pump for generating a voltage which is either higher than the voltage of an externally-applied positive supply voltage or lower than the voltage of an externally-applied negative supply voltage. In one disclosed embodiment, a voltage pump generates a pumped voltage and a voltage regulator provides a regulated voltage, where the pumped voltage is characterized as being either more positive than the most positive externally-applied positive voltage supply signal or more negative than the most negative externally-applied negative voltage signal. The pumped voltage and the regulated voltage are applied to respective inputs of a multiplexer receiving a select signal. In response to the state of the select signal, the multiplexer outputs either the regulated voltage or the pumped voltage. In an alternative embodiment, a non-regulated form of the externally-applied voltage is utilized in place of the regulated voltage. In any case, the multiplexer is conditioned to selectively output either the pumped voltage or the regulated or non-regulated voltage. The output of the multiplexer is provided to the input of an array network for distribution of the incoming signal to functional elements of the semiconductor device. Preferably, the multiplexer is controlled by a select signal whose state is appropriate to cause the multiplexer to apply the pumped voltage to the array network during active operational cycles of the semiconductor device, and to provide the regulated or non-regulated voltage to the array network during idle or standby operation of the semiconductor device. In one embodiment of the invention, the multiplexer is configured to incorporate at least one current-limiting element to limit the current supplied to the array network when the regulated or non-regulated voltage is applied thereto. One or more long length (long L) transistors may be employed as the current-limiting elements.

30 Claims, 4 Drawing Sheets

METHOD AND APPARATUS FOR REDUCING GATE-INDUCED DIODE LEAKAGE IN SEMICONDUCTOR DEVICES

FIELD OF THE INVENTION

This invention relates generally to semiconductor devices, and more particularly relates to methods and apparatuses for reducing power consumption of semiconductor devices.

BACKGROUND OF THE INVENTION

The field of semiconductor memory devices generally and complementary metal-oxide semiconductor (CMOS) devices in particular is enormously active and rapidly developing. Various categories and sub-categories of semiconductor devices are known and commercially available. The ever-increasing popularity and ubiquity of computers and computer-based devices, both in the consumer and industrial realms, is such that the demand for semiconductor memory devices of a variety of different types will continue to grow for the foreseeable future.

In the field of semiconductor fabrication, a persistent issue has been that of current leakage through thin dielectric layers. Those of ordinary skill in the art will appreciate that leakage through the gate dielectrics of field-effect transistors (FETs) is common referred to Fowler-Nordheim tunneling, whereas gate-induced diode leakage (GIDL) occurs at the edge of gate electrode. (This phenomenon is also interchangeably referred to as gate-induced drain leakage.) It is believed that any transistor having a gate overlying source or drain diffusion region to at least some extent is susceptible to GIDL. As gate dielectrics, which are typically formed of silicon oxide, become increasingly thinner due to continued scaling of semiconductor structures in pursuit of faster and more efficient operation, problems relating to GIDL present an ongoing challenge to circuit designers.

Figure 1:
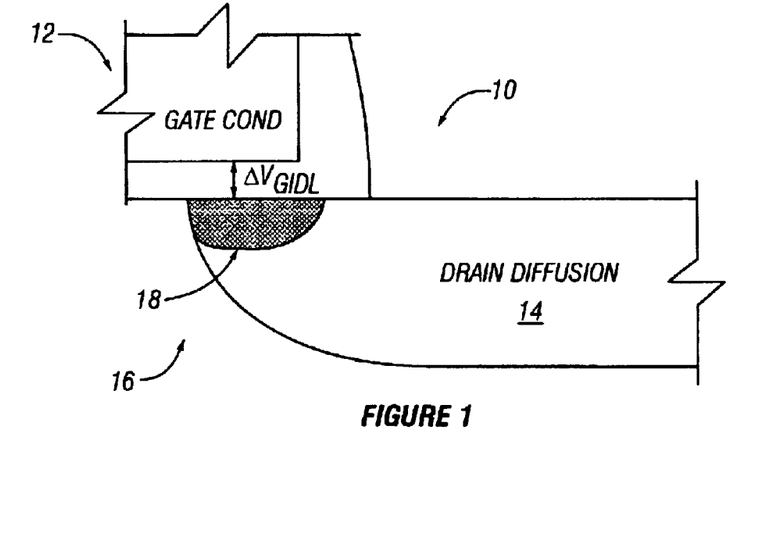
FIG. 1 is a side, cross-sectional view of a portion of a field-effect transistor (FET) implemented on a semiconductor substrate.

GIDL results from the generation of electron-hole pairs in the surface of the depletion region of a FET along the area where the gate conductor overlies the drain diffusion region (separated by a dielectric layer) when the device is biased such that the drain potential is greater than the gate potential (for NMOS devices) or lower than the gate potential (for PMOS devices). FIG. 1 is a side cross-sectional illustration of a portion of a FET 10 including a gate conductor 12 and a drain diffusion region 14 formed on a silicon substrate 16. As shown in FIG. 1, it is often the case that a portion of the drain diffusion region 14 of a FET is positioned under the gate conductor 12. As a result, for an NMOS device, if the gate conductor 12 is at 0 volts and the drain diffusion region 14 is at a positive voltage, there is volume 18 of carrier generation due to the electric field induced by the drain-to-gate voltage differential $\Delta V_{GIDL}$. Such carrier generation tends to impair device performance. In addition to increasing standby power, in the context of dynamic random access memory devices, GIDL can degrade data retention time, such that the maximum time between refreshes of a memory array is undesirably decreased.

Various approaches have been proposed in the prior art for overcoming GIDL phenomena in semiconductor devices. Prominent among these are strategies for either increasing the thickness of the gate oxide in a FET, or for otherwise making the gate oxide more resistant to leakage current; various doping strategies for minimizing GIDL effects have also been proposed. Various approaches are proposed, for example, in U.S. Pat. No. 6,294,421 to Gonzalez et al., entitled "Method of Fabricating Dual-Gate Dielectric;" in U.S. Pat. No. 6,097,070 to Mandelman et al, entitled "MOSFET Structure and Process for Low Gate Induced Drain Leakage (GILD) [sic];" in U.S. Pat. No. 6,090,671 to Balasubramanyam et al., entitled "Reduction of Gate-induced Drain Leakage in Semiconductor Devices;" and U.S. Pat. No. 6,297,105 to Guo, entitled "Method of Forming Asymmetric Source/Drain for a DRAM Cell." Each of the foregoing patents is hereby incorporated by reference herein in its entirety.

Despite semiconductor designers' ongoing efforts to stabilize and minimize the power consumption of semiconductors and in particular to minimize the undesirable phenomenon of GIDL, there nevertheless continues to be an ongoing need for improvements in the field. Among other considerations, the various proposed strategies for alleviating GIDL phenomenon in semiconductor devices often suffer to greater or lesser extents from the disadvantages of unduly increasing device size, adding complexity to the fabrication process, or degrading device performance.

Those of ordinary skill in the art will further appreciate that problems with GIDL are exacerbated in semiconductor devices which utilize charge pumps which are capable of providing voltages more positive than the most positive externally-applied supply voltage and/or more negative than the most negative externally-applied supply voltage. Such charge pumps are well known in the art, as are their numerous advantageous applications in semiconductor devices such as memory devices and the like. Charge pumps may be utilized to provide a bias voltage for a substrate of an integrated circuit, or for providing greater output voltage swings. Examples of charge pump circuits are disclosed in U.S. Pat. No. 5,038,325 to Douglas et al., entitled "High Efficiency Charge Pump Circuit," and U.S. Pat. No. 5,126,590 to Chern, entitled "High Efficiency Charge Pump." The '325 and '590 patents are commonly assigned to the assignee of the present invention and are hereby incorporated herein by reference in their respective entireties.

Figure 2:
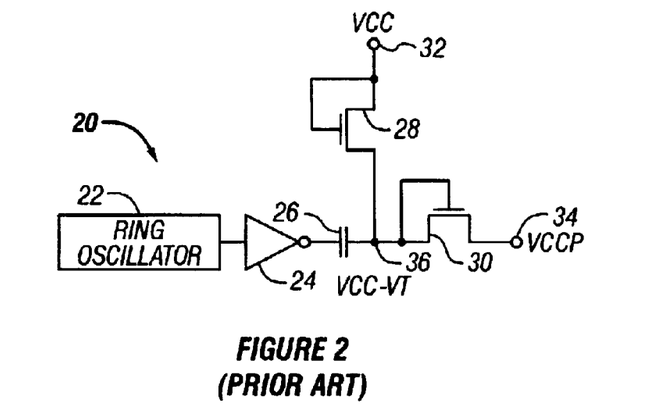
FIG. 2 is a schematic/block diagram of a conventional charge pump circuit.

As noted in the '590 patent, most charge pumps comprise some variation of the basic charge pump 20 shown in the schematic diagram of FIG. 2. The basic charge pump 20 configuration includes a ring oscillator 22 that provides a square wave or pulse train having voltage swings typically between ground and the most positive external power supply voltage, VCC. An inverter 24, buffer amplifier, or Schmitt trigger circuit may be used to sharpen the edges of the oscillating output signal of the ring oscillator 22. A capacitor 26 is discharged into the substrate 34 through diode-connected transistors 28 and 30. (Typically the drain and gate of a diode-connected transistor are coupled together to form the anode of a diode and the source forms the cathode of the diode.) Transistor 28 is coupled to the external power supply voltage, VCC, at terminal 32. When the ring oscillator 22 produces a voltage close to ground, circuit node 36 is approximately at the voltage of the power supply minus a transistor threshold voltage, VCC-VT. When the ring oscillator 22 produces a voltage close to VCC, the incremental charge on the capacitor 26 is delivered to the substrate 34. Capacitor 26 is prevented from discharging to any other circuit node by the reverse bias on diode-connected transistors 28 and 30.

As noted above, because charge pumps produce on-chip voltages more positive and/or more negative than the respective positive and/or negative supply voltages, integrated circuits incorporating charge pumps are even more susceptible to problems associated GIDL.

SUMMARY OF THE INVENTION

In view of the foregoing considerations, the present invention is directed to a method and apparatus for reducing the effects of GIDL in semiconductor devices, especially semiconductor devices incorporating charge pump circuits.

In one embodiment of the invention, the invention involves the multiplexing of a pumped voltage and a regulated voltage in a pumped voltage supply circuit, such that functional elements of a semiconductor device are provided with a pumped voltage during operationally active periods and are provided with a slightly reduced regulated voltage during idle or standby operational periods. (As used herein, the terms "idle" or "standby" modes shall be understood to refer to intervals where a semiconductor device is powered-up, but not active. In the context of semiconductor memory devices, such a situation would exist when the memory device is powered up, but no memory access cycles are occurring.)

In a disclosed embodiment, a voltage pump generates a pumped voltage and a voltage regulator provides a regulated voltage, where the pumped voltage is characterized as being either more positive than the most positive externally-applied positive voltage supply signal or more negative than the most negative externally-applied negative voltage signal. The pumped voltage and the regulated voltage are applied to respective inputs of a multiplexer receiving a select signal. In response to the state of the select signal, the multiplexer outputs either the regulated voltage or the pumped voltage.

In an alternative embodiment, a non-regulated form of the externally-applied voltage is utilized in place of the regulated voltage. In any case, the multiplexer is conditioned to selectively output either the pumped voltage or the regulated or non-regulated voltage. The output of the multiplexer is provided to the input of an array network for distribution of the incoming signal to functional elements of the semiconductor device. Preferably, the multiplexer is controlled by a select signal whose state is appropriate to cause the multiplexer to apply the pumped voltage to the array network during active operational cycles of the semiconductor device, and to provide the regulated or non-regulated voltage to the array network during idle or standby operation of the semiconductor device.

In one embodiment of the invention, the multiplexer is configured to incorporate at least one current-limiting element to limit the current supplied to the array network when the regulated or non-regulated voltage is applied thereto. One or more long length (long L) transistors may be employed as the current-limiting elements.

BRIEF DESCRIPTION OF THE DRAWINGS

The foregoing and other features and aspects of the present invention will be best understood with reference to the following detailed description of a specific embodiment of the invention, when read in conjunction with the accompanying drawings, wherein.

DETAILED DESCRIPTION OF A SPECIFIC EMBODIMENT OF THE INVENTION

In the disclosure that follows, in the interest of clarity, not all features of actual implementations are described. It will of course be appreciated that in the development of any such actual implementation, as in any such project, numerous engineering and programming decisions must be made to achieve the developers' specific goals and subgoals (e.g., compliance with system and technical constraints), which will vary from one implementation to another. Moreover, attention will necessarily be paid to proper engineering practices for the environment in question. It will be appreciated that such a development effort might be complex and time-consuming, but would nevertheless be a routine undertaking for those of ordinary skill in the relevant fields.

Furthermore, for the purposes of the present disclosure, the terms "comprise" and "comprising" shall be interpreted in an inclusive, non-limiting sense, recognizing that an element or method step said to "comprise" one or more specific components may include additional components. Also, it is to be understood that the terms "coupled" and "coupled to" as used to describe the interrelationship of two recited elements shall be interpreted so as to not exclude the possibility of intermediate elements disposed between the recited elements. That is, a first element may be "coupled to" a second element indirectly by means of one or more additional elements (for example (without limitation), a resistor, a transistor, or an inverter, and the terms "coupled" and "coupled to" shall necessarily not be interpreted as either implying or excluding being "coupled directly" or "coupled directly to." Such a distinction is especially relevant in situations where a first element is "selectively" coupled to a second element, for example through the source-to-drain path of a transistor, or where a logic signal passes through an even number of inverters.

Figure 3:
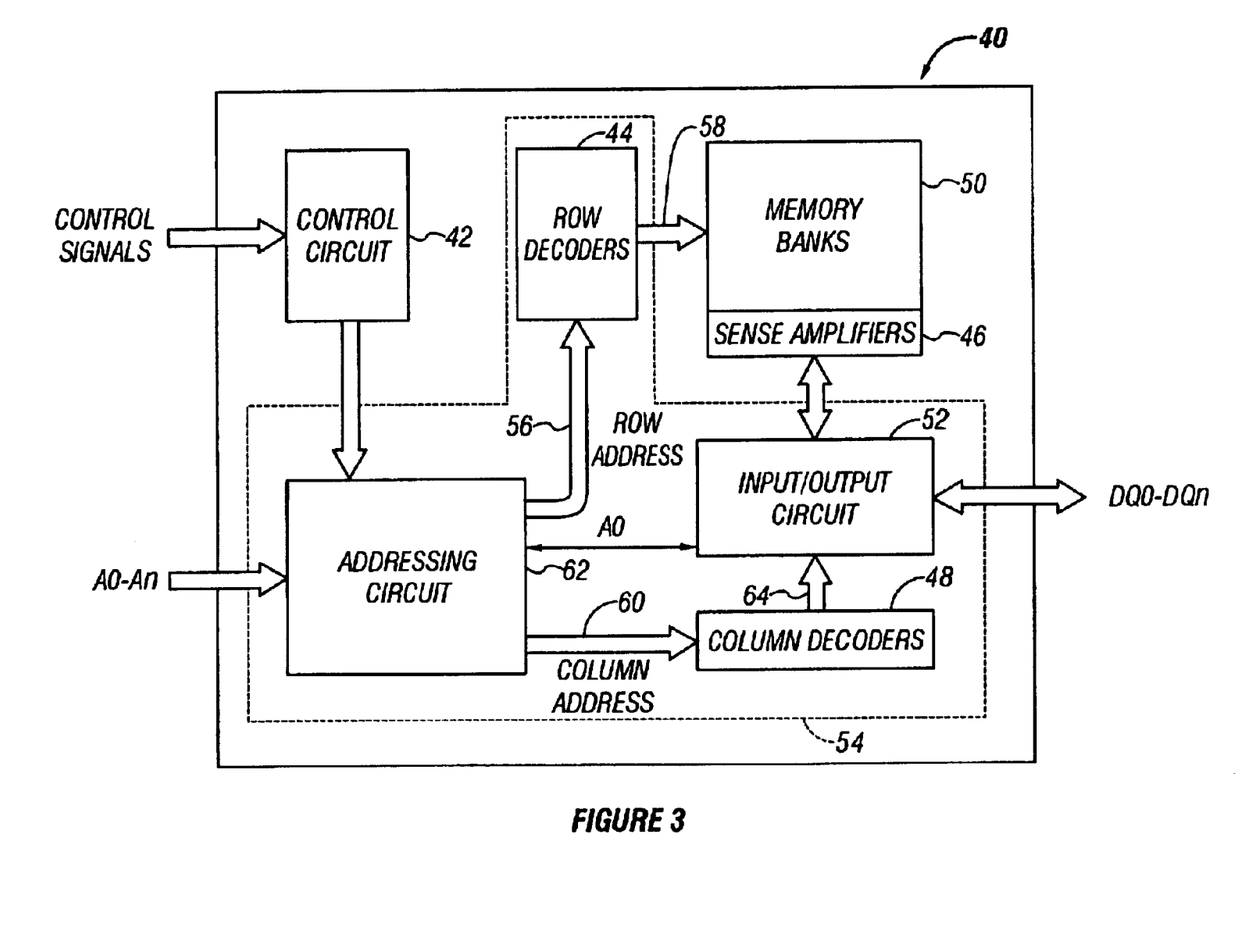
FIG. 3 is a block diagram of a semiconductor memory device with which the present invention may be advantageously applied.

Referring to FIG. 3, there is shown a highly simplified schematic/block diagram of a semiconductor memory device 40 in accordance with one embodiment of the invention. In the disclosed embodiment, memory device 40 is a dynamic random access memory (DRAM), although those of ordinary skill in the art having the benefit of the present disclosure will appreciate that the invention may not be limited in scope to application in DRAM only. It will also be understood that DRAM 10 incorporates a substantial amount of circuitry in addition to those functional components specifically represented in FIG. 3. However, such other circuitry has been omitted in the interests of brevity and clarity, since such circuitry is well-known to those of ordinary skill in the art and is not especially relevant to the practice of the present invention.

Memory device 40 includes a control circuit 42, addressing circuit 62, input/output circuit 52, memory banks 50, sense amplifier circuits 46, column decoders 48 and row decoders 44. In a preferred embodiment, four memory banks 50, sense amplifier circuits 46, column decoders 48 and row decoders 44 are used, but for convenience purposes only, FIG. 3 illustrates only one memory bank 50, sense amplifier circuit 46, column decoder 48 and row decoder 44. In a preferred embodiment, four memory banks 50 are used, but it must be noted that the present invention can utilize, for example, one, two, four, eight or more memory banks 50. The row and column decoders 44, 48, addressing circuit 62 and input/output logic circuit 52 comprise a read/write path circuit 54 providing a data path for reading and writing data into the banks 50 from an external device (through input/output pins DQ0–DQn). It is to be noted that the illustrated configuration of the read/write path circuit 50 is but one of many possible configurations and the invention is not to be so limited to the specific circuit illustrated in FIG. 3. Memory device 40 also contains a plurality of input/output pins DQ0–DQn.

Control circuit 42 is coupled to address circuit 62 and receives various external control signals as inputs. By way of example but not limitation, control circuit 42 may receive a chip select (CS*) signal and a RESET signal, row and column address strobe (RAS and CAS) signals, a write enable (WE*) signal, and so on. Those of ordinary skill in the art will be familiar with the various control signals applied to a typical memory device such as device 40. Although not shown in FIG. 3, control circuitry 42 is likely to be coupled to most of the other functional components of device 40, in a conventional arrangement, such that control circuitry 42 is capable of interpreting the various control signals applied thereto and drive and control the overall operation of the remaining circuitry in device 40.

In operation, the address of a memory location to be accessed (written to or read from) is applied to address inputs A0–An in conjunction with an appropriate sequence of control signals being applied to control circuit 42 according to the operation to be performed. Row address data is communicated to row decoders 44 by a row address bus. In a conventional manner, row decoders operate to assert appropriate word lines 58 that are applied to memory bank 50 to select a desired row therein. The row of data selected by an asserted row line is applied to I/O circuit 52. Column address information applied to address inputs A0–An is communicated to column decoders 48 by way of a column address bus 60. Column decoders decode the column addresses and assert appropriate column select lines 64 to select the desired bits in the selected row. The selected data is the presented on I/O pins DQ0–DQn.

It is to be understood that although the various functional components of device 40 depicted in FIG. 3 are shown as separate, discrete circuits disposed in a well-defined spatial relationship with respect to one another, in actual implementation, the various circuits are likely to be dispersed throughout part or all of the semiconductor substrate, with portions of certain functional components being interspersed with one another. That is, FIG. 3 depicts device 40 from a functional perspective rather than a physical layout perspective.

In one embodiment of the invention, memory device 40 employs P-channel row-driver pull-up devices to drive the row lines 58. The gates of the row-driver are preferably driven by a pumped voltage, in accordance with conventional practice in the art to maximize operational efficiency of the device. Consequently, as will be appreciated by those of ordinary skill in the art, the opportunity exists especially during idle states for the P-channel row driver pull-up transistors to have a pumped voltage applied to their gates and a ground (VSS) voltage applied to their source and/or drain terminals. This can undesirably lead to manifestations of the above-described GIDL phenomenon. Such distributed GIDL current in large density DRAMs can create problems meeting idle or standby current specifications.

Figure 4:
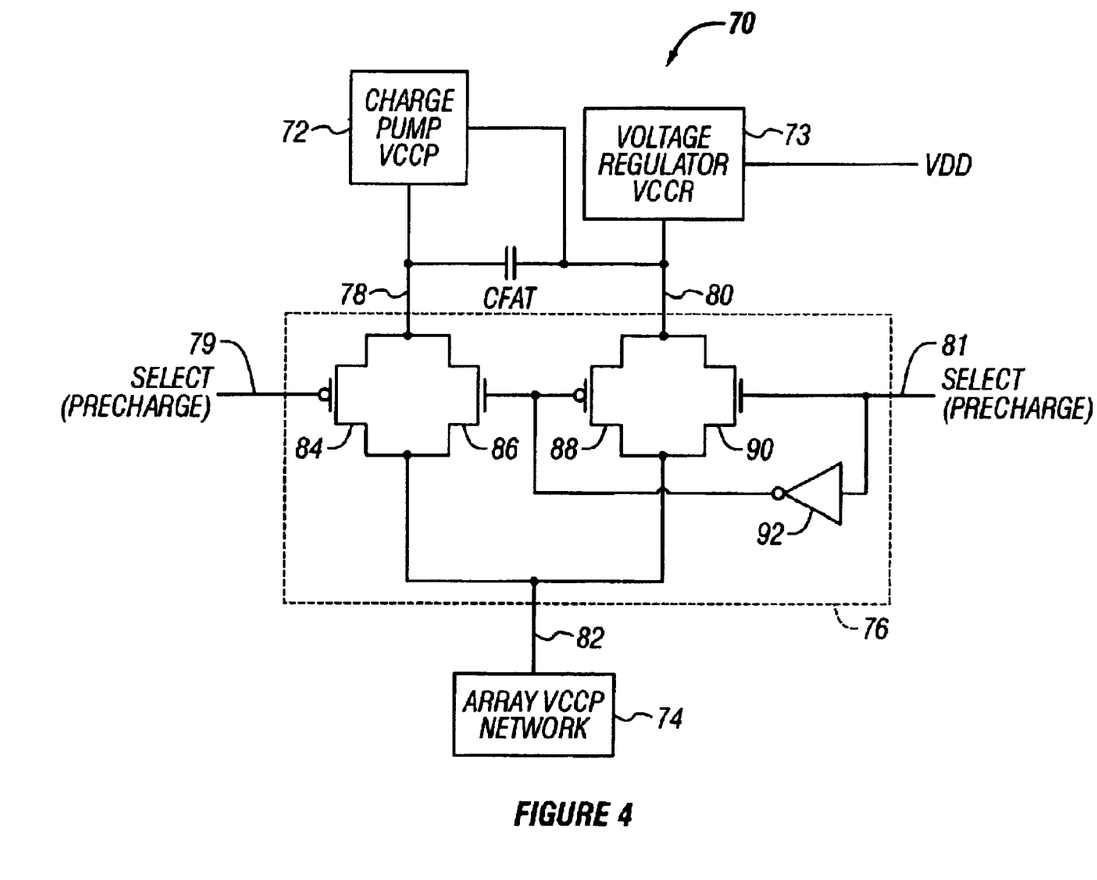
FIG. 4 is a schematic diagram of a pumped voltage generation circuit in accordance with one embodiment of the invention.

To address the pumped voltage GIDL problem, the present invention involves multiplexing the pumped voltage node in the array to a lower voltage regulated or external power rail during standby operation as a means for reducing GIDL current. Turning to FIG. 4, there is shown a schematic/block diagram of a pumped voltage supply circuit 70 in accordance with one embodiment of the invention.

As shown in FIG. 4, pumped voltage supply circuit 70 includes a charge pump 72. Charge pump circuit 72 may be implemented in a variety of known or to-be-discovered ways, and is characterized by its generation of a pumped voltage VCCP having a level which either exceeds the highest positive voltage supplied to device 40 or which is lower than the lowest negative voltage supplied to device 40. In the embodiment of FIG. 4, an external voltage VDD is supplied to memory device 40 via an input pin to device 40 and applied to a voltage regulator circuit 73. Voltage regulator circuit is of conventional design and operates to generate a regulated on-chip voltage VCCR which is supplied to various functional elements of device 40. It is believed that the design and operation of voltage regulator circuit 73 would be well known to those of ordinary skill in the art, and no further disclosure of the details of its implementation is provided herein.

With continued reference to FIG. 4, in one embodiment the regulated supply voltage VCCR is applied to charge pump 72, which operates to generate pumped voltage VCCP in accordance with conventional techniques.

In a conventional memory device incorporating a charge pump, the pumped voltage VCCP supplied directly to an array VCCP network for distribution of the pumped voltage to the various operational elements in the array 50 which require it, for example, row driver pull-up devices. In FIG. 4, the array VCCP network is represented by block 74. As would be appreciated by those of ordinary skill in the art, array VCCP network 74 is implemented as a pattern of conductors on the semiconductor substrate for conveying a pumped voltage to various locations on the die. As noted above, however, such an arrangement undesirably increases the opportunity for unwanted GIDL currents to be established through the pull-up devices, especially during idle or standby operation of the device.

With continued reference to FIG. 4, the present invention addresses the pumped voltage GIDL problem by multiplexing the pumped voltage VCCP with a lower voltage, for example, the regulated internal positive supply voltage VCCR. In the disclosed embodiment, such a multiplexing function is performed by a multiplexer 76 having two inputs 78 and 80, and one output 82. Multiplexer 76 further receives a select signal at inputs 79 and 81 for selecting one of the two inputs 78 and 80 is coupled to output 82. A power rail decoupling capacitance CFAT 83 having a capacitance the same or more than the memory array 50 is provided for fast charge sharing.

In the disclosed embodiment, the select signal is an internal signal PRECHARGE, which is a signal that is asserted (a logical low level) by control circuit 42 in advance of each memory access cycle, in order to condition memory 40 for an access to memory banks 50. In accordance with conventional implementations, the PRECHARGE signal indicates when the device is in a "no banks active" state.

Multiplexer 76 comprises a first pair of field-effect transistors 84 and 86, with transistor 84 being a P-channel FET and transistor 86 being an N-channel FET. Multiplexer 76 further comprises a second pair of FETs 88 and 90, with transistor 88 being a P-channel FET and transistor 90 being an N-channel FET. Transistors 84 and 90 each receive the select (PRECHARGE) signal on their respective gates. Multiplexer 76 further comprises an inverter 92 which receives the select (PRECHARGE) signal at its input. The output of inverter 92—the logical complement of the select (PRECHARGE) signal is applied to the gates of transistors 86 and 88.

As will be apparent to those of ordinary skill in the art, when the select signal (PRECHARGE) is unasserted (a logical high level), transistors 88 and 90 are turned on (conductive), and transistors 84 and 86 are turned off. On the other hand, when the select signal (PRECHARGE) is asserted (a logical low level), transistors 88 and 90 are turned off, and transistors 84 and 86 are turned on. Therefore, when the select signal is asserted, the pumped voltage VCCP appears at the output 82 of multiplexer 82, whereas when the select signal is unasserted, the regulated VCCR voltage appears at output 82. Because the PRECHARGE signal is asserted in advance of and during each memory array access cycle, and unasserted during idle or standby operation, this means that the pumped voltage VCCP is applied to array VCCP network 74 only during memory access cycles, and the lower, regulated VCCR supply voltage is applied to array VCCP network 74 during idle or standby operation of memory 40. That is, multiplexer 76 functions to couple one of the pumped voltage VCCP and the regulated voltage VCCR to array VCCP network at any given time based on the logical state of the select (PRECHARGE) signal.

In accordance with one aspect of the invention, transistors 88 and 90 preferably function as currently limiting devices to limit VCCR current through array VCCP network 74 during standby or idle operation of device 40. To this end, transistors 88 and 90 are preferably long length (long L) devices. When the select (PRECHARGE) signal is not asserted, the regulated voltage VCCR is coupled to multiplexer output 82 via the source-to-drain paths of two long L, current limiting transistors 88 and 90, thereby limiting the amount of current drawn during standby or idle operation of device 40. Such current limiting functionality of FETs is discussed in U.S. Pat. No. 6,310,802 to Ma et al, commonly assigned to the assignee of the present invention and hereby incorporated by reference herein in its entirety.

At the same time, the widths of transistors 88 and 90 are preferably tailored in conjunction with the long length such that the current through those transistors is slightly greater than the array's standby GIDL current, in order to maintain sufficient voltage at the output 82 of multiplexer 76.

On the other hand, transistors 84 and 86 preferably have a large width and short length, in order to provide the maximum possible current from the VCCP charge pump 72 to array VCCP network 74 during memory array access cycles.

Figure 5:
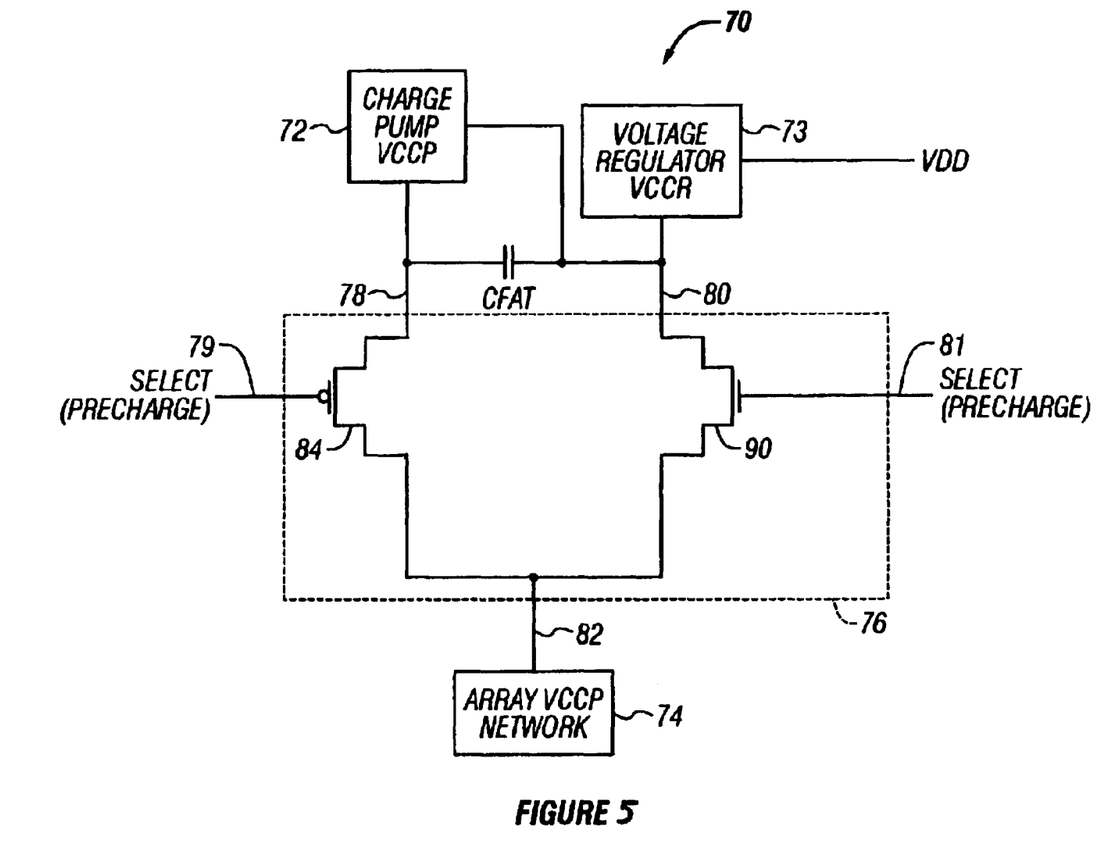
FIG. 5 is a schematic diagram of a pumped voltage generation circuit in accordance with an alternative embodiment of the invention.

Turning to FIG. 5, there is shown an alternative embodiment of the invention designated with reference numeral 70', which differs from the embodiment of FIG. 4 principally in the omission of transistors 86 and 88, and of inverter 92. In the embodiment of FIG. 5, circuit elements which are substantially identical to those in the embodiment of FIG. 4 retain identical reference numerals.

It is contemplated that it is not necessary to force the voltage on output node 82 of the pumped voltage supply circuit 70' to the regulated voltage VCCR, and that hence transistors 86 and 88 are not necessary. In the embodiment of FIG. 5, the voltage on output node 82 is permitted to float down to a threshold voltage less than VCCR upon deassertion of the select (PRECHARGE) signal. The long width and short length of transistor 84 relative to the short width and long length of transistor 90 enables the voltage on node 82 to recover quickly to the pumped voltage level VCCP upon assertion of the select (PRECHARGE) signal.

From the foregoing detailed description of specific embodiments of the invention, it should be apparent that a method and apparatus for reducing current leakage in a semiconductor device has been disclosed. Although specific embodiments of the invention have been disclosed herein in some detail, this has been done solely for the purposes of describing various features and aspects of the invention, and is not intended to be limiting with respect to the scope of the invention. It is contemplated that various substitutions, alterations, and/or modifications may be made to the disclosed embodiment, including but not limited to those implementation variations which may have been suggested herein, may be made to the disclosed embodiments without departing from the spirit and scope of the invention as defined by the appended claims, which follow.

In particular, one contemplated variation is that the voltage with which the pumped voltage may be multiplexed may be an unregulated supply voltage, such as the externally-applied VDD voltage before regulation by voltage regulator 73. Further, it is contemplated that multiplexer 76 may be implemented in alternative fashions, as would be apparent to those of ordinary skill in the art.

Also, while the present invention has been disclosed in the context of a charge pump for generating a pumped voltage which exceeds the voltage of the maximum positive voltage applied from external to the semiconductor device, it is believed that those having the benefit of the present disclosure will be readily capable of adapting the disclosed embodiment to address charge pumps for generating voltages which are below that of the voltage of the minimum voltage applied from external to the semiconductor device.

Furthermore, whereas the present invention has been disclosed in the context of a semiconductor device comprising a memory device, it is contemplated that the present invention may be advantageously practiced in conjunction with virtually any type of semiconductor device incorporating a charge pump. It is believed that those of ordinary skill in the art having the benefit of the present disclosure will be readily able to apply the teachings of the present disclosure to various semiconductor devices without any undue experimentation.

What is claimed is:

1. A pumped voltage supply circuit for a semiconductor device operable in an an idle mode and in an active mode and having an input terminal for receiving a supply voltage, comprising:

a voltage regulator for generating a regulated supply voltage;

a charge pump for generating a pumped voltage greater than said supply voltage;

a multiplexer having a first input for receiving said pumped voltage and a second input for receiving said regulated supply voltage, said multiplexer further having a select signal input and an output;

a network coupled to said multiplexer output for distributing said pumped voltage to operational elements of said semiconductor device;

wherein said multiplexer is responsive to a select signal applied to said select signal input to apply said regulated supply voltage to said multiplexer output when said device is operating in said idle mode and to apply said pumped voltage to said multiplexer output when said device is operating in said active mode.

2. A pumped voltage supply circuit in accordance with claim 1, wherein said multiplexer includes at least one current limiting device for controlling the current drawn through said array VCCP network when said regulated supply voltage is applied to said array VCCP network.

3. A pumped voltage supply circuit in accordance with claim 2, wherein said at least one current limiting device comprises at least one long length transistor.

4. A pumped voltage supply circuit in accordance with claim 3, wherein said at least one current limiting device comprises a long length N-channel transistor and a long length P-channel transistor.

5. A pumped voltage supply circuit in accordance with claim 1, wherein said operational elements of said device comprise row line pull-up transistors.

6. A semiconductor memory device operable in an idle mode and in an active mode, comprising:
   an array of rows and columns of memory cells;
   an input terminal for receiving a supply voltage;
   a voltage regulator for generating a regulated supply voltage;
   a charge pump for generating a pumped voltage greater than said supply voltage;
   a multiplexer having a first input for receiving said pumped voltage and a second input for receiving said regulated supply voltage, said multiplexer further having a select signal input and an output;
   a network coupled to said multiplexer output for distributing said pumped voltage to operational elements of said semiconductor memory device;
   wherein said multiplexer is responsive to a select signal applied to said select signal input to apply said regulated supply voltage to said multiplexer output when said memory device is operating in said idle mode and to apply said pumped voltage to said multiplexer output when said memory device is operating in said active mode.

7. A semiconductor memory device in accordance with claim 6, wherein said multiplexer includes at least one current limiting device for controlling the current drawn through said array VCCP network when said regulated supply voltage is applied to said array VCCP network.

8. A semiconductor memory device in accordance with claim 7, wherein said at least one current limiting device comprises at least one long length transistor.

9. A semiconductor memory device in accordance with claim 8, wherein said at least one current limiting device comprises a long length N-channel transistor and a long length P-channel transistor.

10. A semiconductor memory device in accordance with claim 6, wherein said operational elements of said device comprise row line pull-up transistors.

11. A pumped voltage supply circuit for a semiconductor device operable in an idle mode and in an active mode and having an input terminal for receiving a supply voltage, comprising:
    a charge pump for generating a pumped voltage greater than said supply voltage;
    a multiplexer having a first input for receiving said pumped voltage and a second input for receiving said supply voltage, said multiplexer further having a select signal input and an output;
    a network coupled to said multiplexer output for distributing said pumped voltage to operational elements of said semiconductor device;
    wherein said multiplexer is responsive to a select signal applied to said select signal input to apply said supply voltage to said multiplexer output when said semiconductor device is operating in said idle mode and to apply said pumped voltage to said multiplexer output when said semiconductor device is operating in said active mode.

12. A pumped voltage supply circuit in accordance with claim 11, wherein said multiplexer includes at least one current limiting device for controlling the current drawn through said array VCCP network when said supply voltage is applied to said array VCCP network.

13. A pumped voltage supply circuit in accordance with claim 12, wherein said at least one current limiting device comprises at least one long length transistor.

14. A pumped voltage supply circuit in accordance with claim 13, wherein said at least one current limiting device comprises a long length N-channel transistor and a long length P-channel transistor.

15. A pumped voltage supply circuit in accordance with claim 11, wherein said operational elements of said device comprise row line pull-up transistors.

16. A semiconductor memory device operable in an idle mode and in an active mode, comprising:
    an array of rows and columns of memory cells;
    an input terminal for receiving a supply voltage;
    a charge pump for generating a pumped voltage greater than said supply voltage;
    a multiplexer having a first input for receiving said pumped voltage and a second input for receiving said supply voltage, said multiplexer further having a select signal input and an output;
    a network coupled to said multiplexer output for distributing said pumped voltage to operational elements of said semiconductor device;
    wherein said multiplexer is responsive to a select signal applied to said select signal input to apply said supply voltage to said multiplexer output when said device is operating in said idle mode and to apply said pumped voltage to said multiplexer output when said device is operating in said active mode.

17. A semiconductor memory device in accordance with claim 16, wherein said multiplexer includes at least one current limiting device for controlling the current drawn through said array VCCP network when said regulated supply voltage is applied to said array VCCP network.

18. A semiconductor memory device in accordance with claim 17, wherein said at least one current limiting device comprises at least one long length transistor.

19. A semiconductor memory device in accordance with claim 18, wherein said at least one current limiting device comprises a long length N-channel transistor and a long length P-channel transistor.

20. A semiconductor memory device in accordance with claim 19, wherein said operational elements of said device comprise row line pull-up transistors.

21. A method of operating a semiconductor device operable in an idle mode and in an active mode, comprising:
    (a) supplying a supply voltage to an input terminal of said device;
    (b) generating a regulated supply voltage;
    (c) generating a pumped voltage greater than said supply voltage;
    (d) applying said regulated supply voltage to a first input of a multiplexer;
    (e) applying said pumped voltage to a second input of a multiplexer;
    (f) coupling an output of said multiplexer to an operational element of said device;
    (g) applying a select signal to a control input of said multiplexer to cause said regulated supply voltage to appear at said output when said semiconductor device is operating in said idle mode and said pumped voltage to appear at said output when said semiconductor device is operating in said active mode.

22. A method in accordance with claim 21, further comprising:

(h) conducting said regulated supply voltage through a current limiting device during standby operation of said device.

23. A method in accordance with claim 22, wherein said step (h) of conducting said regulated supply voltage through a current limiting device comprises conducting said regulated supply voltage through a long length transistor.

24. A method in accordance with claim 21, wherein said semiconductor device comprises a semiconductor memory device.

25. A method in accordance with claim 24, wherein said select signal comprises a signal asserted in advance of a memory access cycle.

26. A method of operating a semiconductor device operable in an idle mode and in an active mode, comprising:

(a) supplying a supply voltage to an input terminal of said device;

(b) generating a pumped voltage greater than said supply voltage;

(c) applying said supply voltage to a first input of a multiplexer;

(d) applying said pumped voltage to a second input of a multiplexer;

(e) coupling an output of said multiplexer to an operational element of said device;

(f) applying a select signal to a control input of said multiplexer to cause said supply voltage to appear at said output when said semiconductor device is operating in said idle mode and said pumped voltage to appear at said output when said semiconductor device is operating in said active mode.

27. A method in accordance with claim 26, further comprising:

(h) conducting said supply voltage through a current limiting device during standby operation of said device.

28. A method in accordance with claim 27, wherein said step (h) of conducting said supply voltage through a current limiting device comprises conducting said regulated supply voltage through a long length transistor.

29. A method in accordance with claim 28, wherein said semiconductor device comprises a semiconductor memory device.

30. A method in accordance with claim 29, wherein said select signal comprises a signal asserted in advance of a memory access cycle.

* * * * *